US012733438B2

(12) United States Patent
Otsuka

(10) Patent No.: US 12,733,438 B2
(45) Date of Patent: Sep. 8, 2026

(54) ARTICLE ELEVATING DEVICE

(71) Applicant: Daifuku Co., Ltd., Osaka (JP)

(72) Inventor: Hiroshi Otsuka, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 258 days.

(21) Appl. No.: 18/234,039

(22) Filed: Aug. 15, 2023

(65) Prior Publication Data

US 2024/0063040 A1 Feb. 22, 2024

(30) Foreign Application Priority Data

Aug. 18, 2022 (JP) ................................ 2022-130622

(51) Int. Cl.

| | |
|---|---|
| ***B66C 13/48*** | (2006.01) |
| ***B66C 13/22*** | (2006.01) |
| ***B66C 13/46*** | (2006.01) |
| ***B66D 3/20*** | (2006.01) |
| ***B66D 3/26*** | (2006.01) |
| ***H10P 72/30*** | (2026.01) |

(52) U.S. Cl.

CPC .......... *H10P 72/3206* (2026.01); *B66C 13/22* (2013.01); *B66C 13/46* (2013.01); *B66C 13/48* (2013.01); *B66D 3/20* (2013.01); *B66D 3/26* (2013.01)

(58) Field of Classification Search

CPC ......... B66C 11/00; B66C 11/04; B66C 11/06; B66C 11/12; B66C 19/00; B66C 13/08; B66C 13/085; B66C 13/16; B66C 13/18; B66C 13/22; B66C 13/46; B66C 13/48; B65G 1/0457; B65G 35/00; H01L 21/677; H01L 21/67724; H01L 21/67733; H01L 21/6773; H01L 21/67712

USPC .......................................................... 254/276

See application file for complete search history.

(56) References Cited

U.S. PATENT DOCUMENTS 7,255,238 B2 8/2007 Ikeya
7,464,823 B2 * 12/2008 Nakao ..................... B66C 13/06 212/331
8,374,420 B2 * 2/2013 Murakami ................ B66C 1/28 382/153
8,632,295 B2 * 1/2014 Onishi .............. H01L 21/67733 414/785

(Continued)

FOREIGN PATENT DOCUMENTS

CN 108190749 A * 6/2018
CN 108750955 A * 11/2018 ............. B66C 13/16

(Continued)

*Primary Examiner* — Wade Miles
*Assistant Examiner* — Henrix Soto
(74) *Attorney, Agent, or Firm* — The Webb Law Firm

(57) ABSTRACT

While a controller performs an elevation operation that is at least either an operation of lowering a holder or an operation of raising the holder, the controller (i) calculates a unit elevation amount, which is an amount by which the holder is raised or lowered per unit rotation amount of the drive motor in an elevation operation range that is a range of heights of the holder in the elevation operation, in accordance with a change in a diameter of an outer circumferential surface of a belt wound around a drum due to winding and unwinding of the belt, and (ii) determines a rotation amount of a drive motor for the elevation operation based on the unit elevation amount.

8 Claims, 6 Drawing Sheets

(56) References Cited

U.S. PATENT DOCUMENTS

| | | | | |
|---|---|---|---|---|
| 10,083,847 | B2 * | 9/2018 | Tomida | H01L 21/67259 |
| 10,242,898 | B2 * | 3/2019 | Kinugawa | H01L 21/67733 |
| 10,347,518 | B2 * | 7/2019 | Murakami | H01L 21/67742 |
| 10,460,967 | B2 * | 10/2019 | Suriki | H01L 21/67736 |
| 10,923,370 | B2 * | 2/2021 | Harasaki | H01L 21/681 |
| 10,964,573 | B2 * | 3/2021 | Kobayashi | H01L 21/67259 |
| 2022/0108905 | A1 * | 4/2022 | Suriki | H01L 21/67724 |

FOREIGN PATENT DOCUMENTS

| | | | | | |
|---|---|---|---|---|---|
| CN | 110329917 | A | * | 10/2019 | B66C 11/02 |
| CN | 110645936 | A | * | 1/2020 | B66C 13/16 |
| CN | 112577453 | A | * | 3/2021 | B65G 1/0457 |
| JP | S61114905 | A | * | 6/1986 | |
| JP | H10194410 | A | * | 7/1998 | |
| JP | 2000327272 | A | * | 11/2000 | |
| JP | 200535770 | A | | 2/2005 | |
| WO | WO-2022029086 | A1 | * | 2/2022 | B25J 15/00 |

* cited by examiner

ARTICLE ELEVATING DEVICE

CROSS-REFERENCE TO RELATED APPLICATION

This application claims priority to Japanese Patent Application No. 2022-130622 filed Aug. 18, 2022, the disclosure of which is hereby incorporated by reference in its entirety.

BACKGROUND OF THE INVENTION

1. Field of the Invention

The present invention relates to an article elevating device that includes a holder configured to hold an article, an elevating device configured to raise and lower the holder, and a controller that controls the elevating device.

2. Description of the Related Art

An example of such an article elevating device is disclosed in JP 2005-35770A (Patent Document 1). In the following description of the related art, reference signs used in Patent Document 1 are cited in parentheses. In Patent Document 1, an article elevating device is provided in a transporting apparatus including a vertically movable holder. The transporting apparatus including a vertically movable holder includes a holder (20) that holds a container (3), which is an article, an elevating device that raises and lowers the holder (20), and a control means (33) that controls the elevating device. The elevating device includes a drum (16), a wire (2) wound around the drum (16), and an elevation motor (M1) that drives the drum (16) to rotate. The elevating device lowers the holder (20) by unwinding the wire (2) from the drum (16), and raises the holder (20) by winding the wire (2) around the drum (16).

In the transporting apparatus including a vertically movable holder disclosed in Patent Document 1, an elevation amount of the holder (20) is controlled based on a rotation amount of the elevation motor (M1), which is detected by an elevation amount detection sensor (30) constituted by a rotary encoder. In order to solve a problem described in paragraph 0009 of Patent Document 1, the transporting apparatus including a vertically movable holder is configured to raise the holder (20) by a set elevation amount when it is detected that the holder (20) has been excessively lowered, and thus solve excessive lowering of the holder (20).

Incidentally, a belt is sometimes used instead of a wire as a suspension member wound around a drum as described in paragraph 0075 of Patent Document 1. In this case, a winding diameter that is the diameter of an outer circumferential surface of the belt wound around the drum gradually decreases as the belt is unwound from the drum, and gradually increases as the belt is wound around the drum. That is, the winding diameter of the belt varies depending on the height of the holder (the holder in Patent Document 1). Such a change in the winding diameter of the belt may be a cause of an error in the elevation amount of the holder (a difference from a target elevation amount) in the case where the elevation amount of the holder is controlled based on the rotation amount of a drive motor (the elevation motor in Patent Document 1). In the case where the holder is raised by a set elevation amount when it is detected that the holder has been excessively lowered as is the case with the apparatus disclosed in Patent Document 1, for example, the set elevation amount is set to a relatively small value, and accordingly, it is desirable to suppress an error in the elevation amount of the holder due to a change in the winding diameter of the belt to precisely perform operations for raising or lowering the holder.

SUMMARY OF THE INVENTION

Under the above circumstances, there is demand for a technology that can suppress an error in the elevation amount of the holder due to a change in the winding diameter of the belt, and improve precision of operations for raising or lowering the holder.

An article elevating device according to the present invention includes: a holder configured to hold an article; an elevating device configured to raise and lower the holder; and a controller configured to control the elevating device, wherein the elevating device includes a drum, a belt that is wound around the drum in such a manner as to be capable of being unwound from the drum and wound around the drum, a drive motor configured to drive the drum to rotate, and a transmission mechanism configured to transmit driving force from the drive motor to the drum, the elevating device lowers the holder by unwinding the belt from the drum and raises the holder by winding the belt around the drum, while the holder is suspended with the belt, and while the controller performs an elevation operation that is at least either an operation of lowering the holder or an operation of raising the holder, the controller (i) calculates a unit elevation amount, which is an amount by which the holder is raised or lowered per unit rotation amount of the drive motor in an elevation operation range that is a range of heights of the holder in the elevation operation, in accordance with a change in a diameter of an outer circumferential surface of the belt wound around the drum due to winding of the belt and unwinding of the belt, and (ii) determines a rotation amount of the drive motor for the elevation operation based on the unit elevation amount.

With this configuration, when an elevation operation of the holder is to be performed, the unit elevation amount in the elevation operation range in which the elevation operation is performed can be calculated in accordance with a change in a winding diameter, or the diameter of the outer circumferential surface of the belt wound around the drum due to winding of the belt and unwinding of the belt. Then, the rotation amount of the drive motor for the elevation operation of the holder can be determined based on the unit elevation amount calculated as described above.

Accordingly, even in a case where the elevation operation range changes every time an elevation operation of the holder is performed, it is possible to appropriately determine the rotation amount of the drive motor for each elevation operation of the holder with use of the unit elevation amount corresponding to the elevation operation range of that operation. Therefore, it is possible to suppress an error in the elevation amount of the holder due to a change in the winding diameter of the belt, and improve precision of the elevation operation of the holder.

Further features and advantages of the article elevating device will be clarified by the embodiments described below with reference to the drawings.

DESCRIPTION OF THE INVENTION

Figure 1:
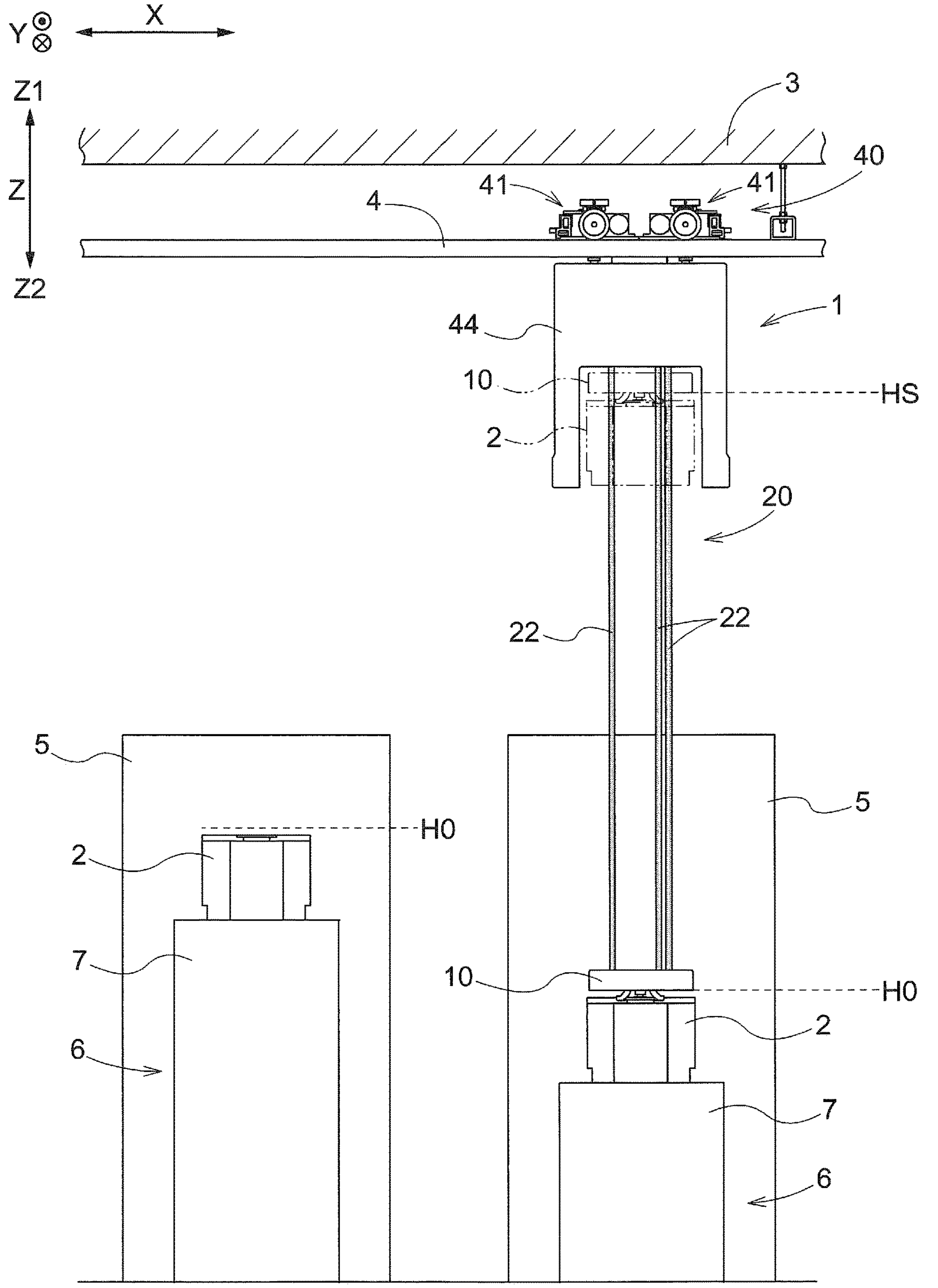
FIG. 1 is a diagram showing an article elevating device and a placement portion according to an embodiment.
Figure 2:
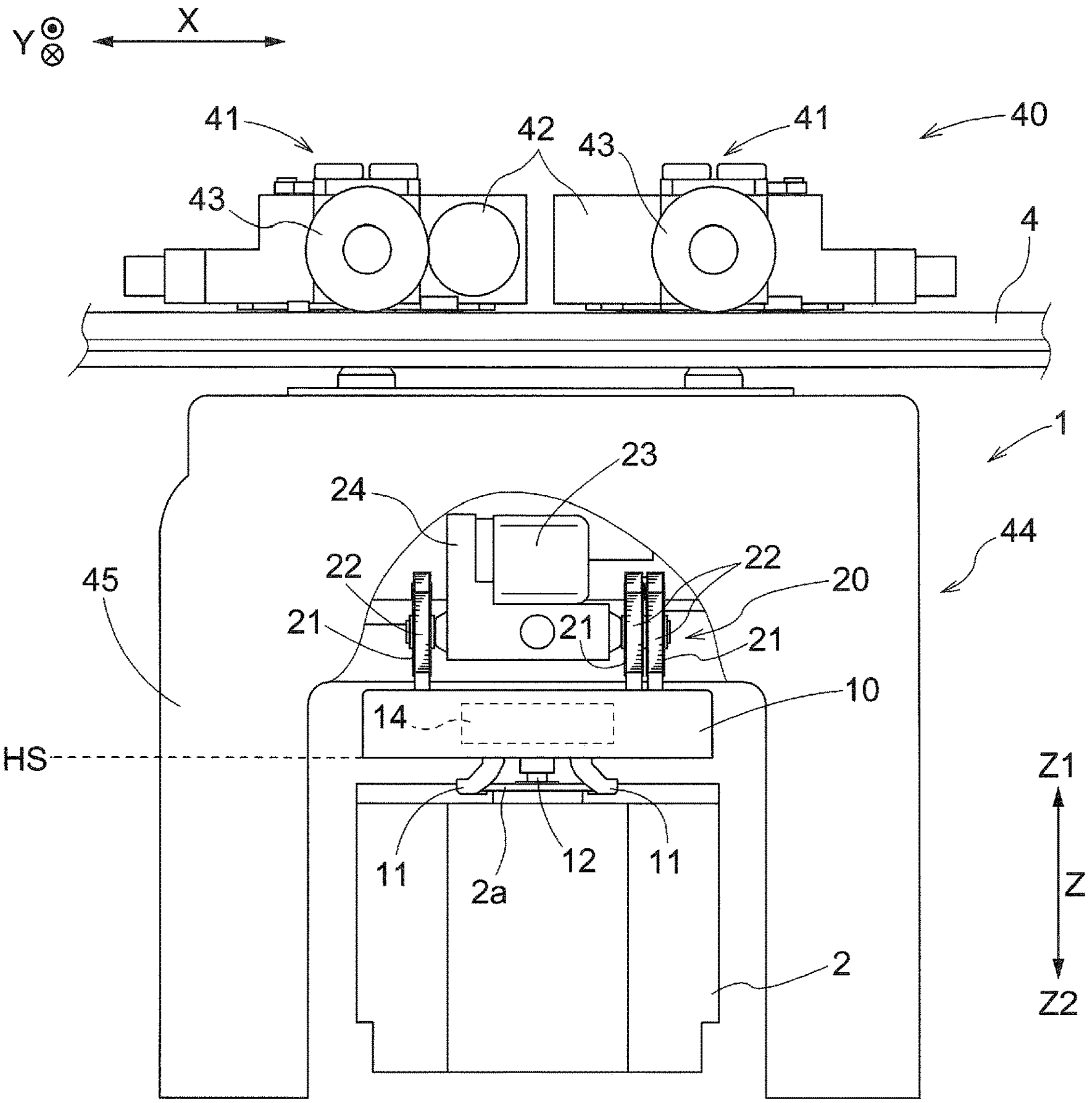
FIG. 2 is a diagram showing the article elevating device according to an embodiment.
Figure 3:
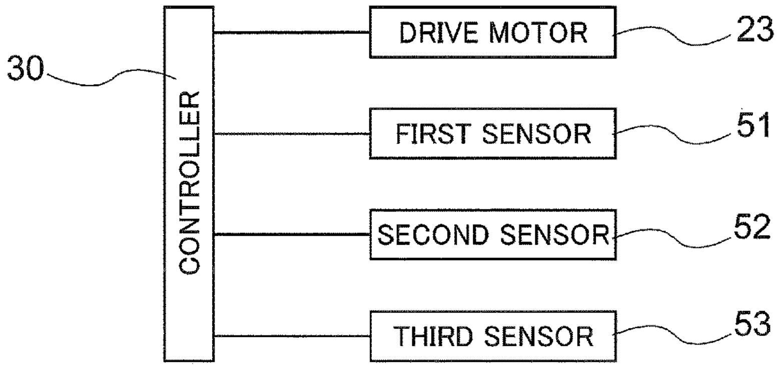
FIG. 3 is a control block diagram according to an embodiment.

The following describes an embodiment of an article elevating device with reference to the drawings. As shown in FIGS. 1 to 3, an article elevating device 1 includes a holder 10 configured to hold an article 2, an elevating device 20 configured to raise and lower the holder 10, and a controller 30 configured to control the elevating device 20. In the present embodiment, the article elevating device 1 is included in an article transport vehicle 40. The article transport vehicle 40 is configured to travel in a horizontal direction and transport an article 2. Accordingly, the article elevating device 1 moves in the horizontal direction as the article transport vehicle 40 travels. As described above, the article elevating device 1 in the present embodiment is movable in the horizontal direction.

The article transport vehicle 40 transports an article 2 by traveling along a travel path. Here, the longitudinal direction of the travel path (the direction in which the travel path extends) will be referred to as a path longitudinal direction X, and the width direction of the travel path will be referred to as a path width direction Y. The path width direction Y is orthogonal to both the path longitudinal direction X and an up-down direction Z (the vertical direction). In the example shown in FIGS. 1 and 2, the path longitudinal direction X is orthogonal to the up-down direction Z (that is, the path longitudinal direction X is a horizontal direction) as is the case with the path width direction Y.

The travel path may be formed physically or set virtually. In the present embodiment, the travel path is formed physically with use of rails 4 (here, a pair of rails 4 spaced apart from each other in the path width direction Y) as shown in FIGS. 1 and 2. Also, in the present embodiment, the rails 4 are suspended from a ceiling 3, and the travel path is formed along the ceiling 3. That is, in the present embodiment, the article transport vehicle 40 is an overhead transport vehicle that travels along the travel path formed along the ceiling 3.

The article transport vehicle 40 includes travel sections 41 that travel along the travel path and a body 44 coupled to the travel sections 41. In the present embodiment, the body 44 is coupled to the travel sections 41 in such a manner as to be located on the lower side Z2 with respect to the travel sections 41. In the example shown in FIGS. 1 and 2, the article transport vehicle 40 includes a pair of travel sections 41 that are next to each other in the path longitudinal direction X, and the body 44 is coupled to the pair of travel sections 41.

The travel sections 41 include wheels 43 that roll on travel surfaces (here, surfaces facing the upper side Z1) of the rails 4 and travel motors 42 (for example, electric motors such as servomotors, see FIG. 2) that drive the wheels 43 to rotate. The travel sections 41 travel along the rails 4 as a result of the wheels 43 being rotated by the travel motors 42.

The body 44 includes the holder 10 configured to hold an article 2. As shown in FIG. 2, in the present embodiment, the holder 10 includes supporting members 11 that support a supported portion 2*a* of the article 2 from the lower side Z2. The holder holds the article 2 by supporting the supported portion 2*a* with the supporting members 11. In the present embodiment, the article 2 is a container that houses a substrate such as a semiconductor wafer, although the type of the article 2 is not limited to this example, and the supported portion 2*a* is a flange formed on an upper surface of the article 2.

In the present embodiment, the holder 10 includes a pair of supporting members 11 that are next to each other in the horizontal direction (here, the path longitudinal direction X). The supported portion 2*a* is supported by the pair of supporting members 11 from the lower side Z2 while supporting portions 11*a* of the pair of supporting members 11 are on the lower side Z2 of the supported portion 2*a* (see FIG. 7(*a*)). The supporting portions 11*a* of the pair of supporting members 11 are arranged on the lower side Z2 of the supported portion 2*a* by being inserted into a space formed on the lower side Z2 of the flange constituting the supported portion 2*a*.

The holder 10 includes a holding motor 14 (for example, an electric motor such as a servomotor, see FIG. 2) for holding the article 2 with the holder 10 and releasing the article 2 from the holder 10, and the holder 10 performs operations for holding and releasing the article 2 by being driven by the holding motor 14. In the present embodiment, the holding motor 14 is configured to bring the pair of supporting portions 11*a* closer to each other and away from each other in the horizontal direction. In a holding operation of holding the article 2 with the holder 10, the pair of supporting portions 11*a* are brought closer to each other by the holding motor 14, and each of the supporting portions 11*a* is placed on the lower side Z2 of the supported portion 2*a* (see FIG. 5(*d*)). The holder 10 is raised in this state, and thus the article 2 is raised while being held by the holder 10. In a releasing operation of releasing the article 2 from the holder 10, the pair of supporting portions 11*a* are moved away from each other by the holding motor 14, and each of the supporting portions 11*a* is retracted from the lower side Z2 of the supported portion 2*a* (see FIG. 7(*d*)).

Figure 5:
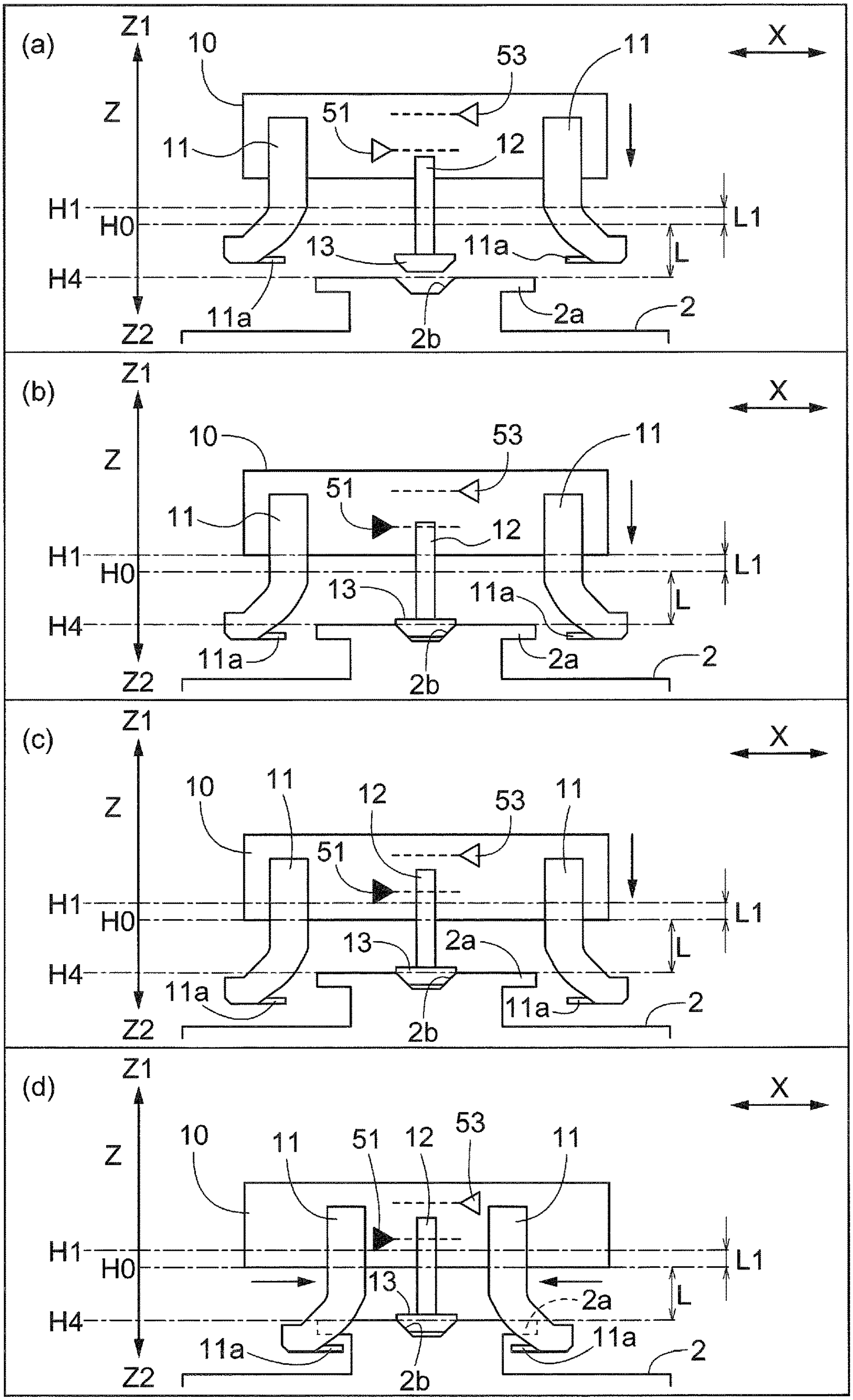
FIG. 5 is a diagram showing a first operation according to an embodiment.
Figure 6:
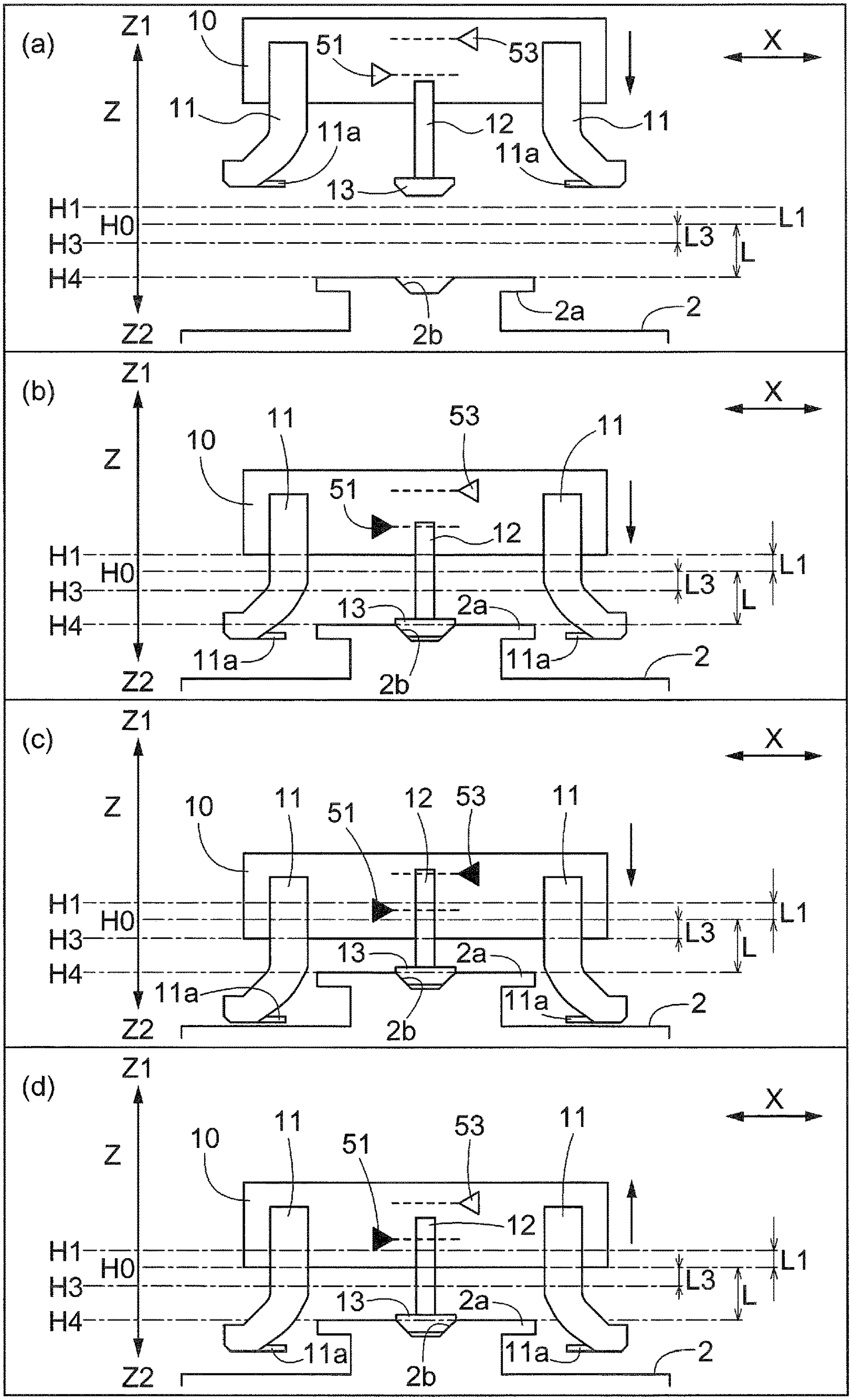
FIG. 6 is a diagram showing a third operation according to an embodiment.
Figure 7:
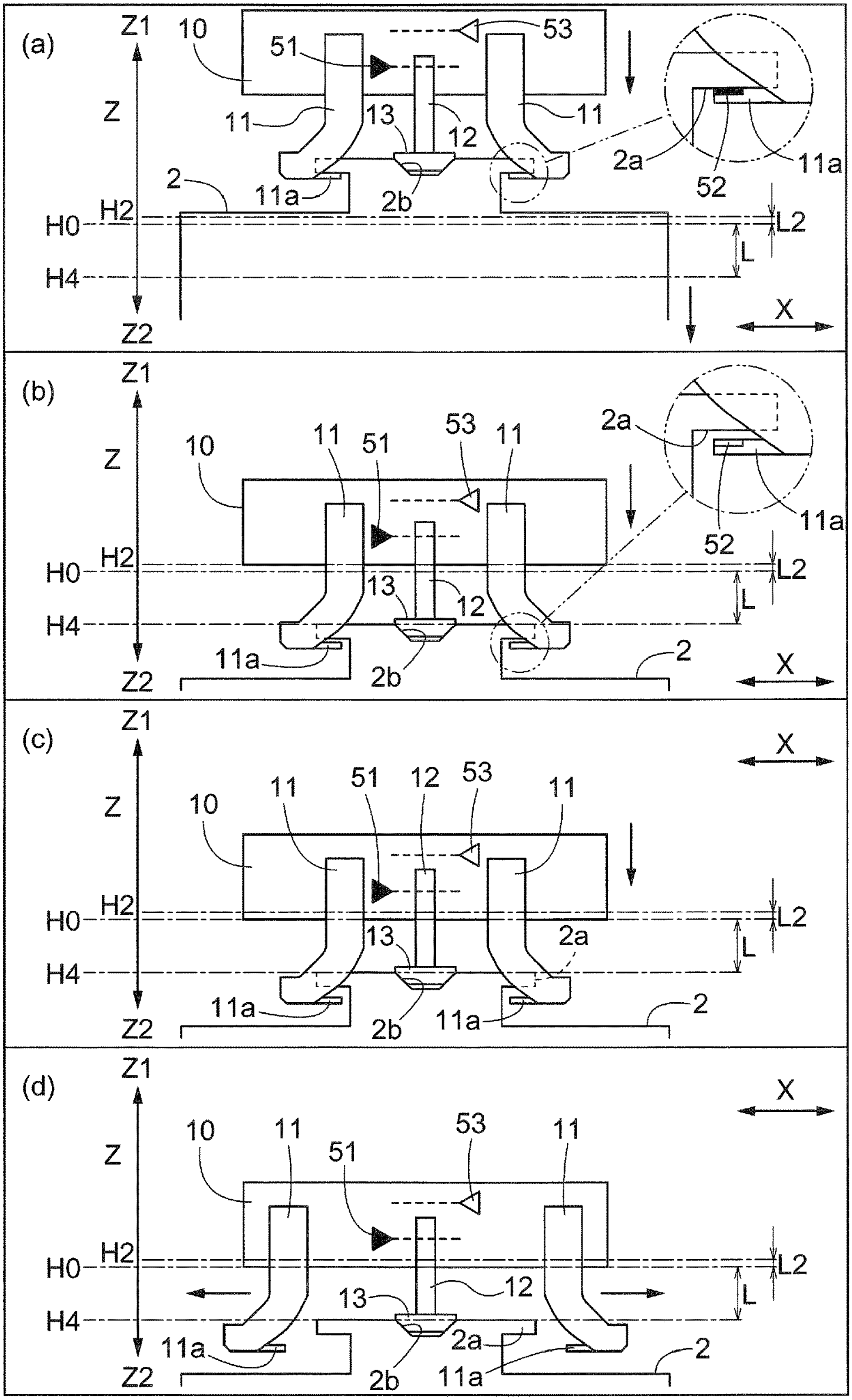
FIG. 7 is a diagram showing a second operation according to an embodiment.

As shown in FIGS. 5 to 7, in the present embodiment, a recessed portion 2*b* that is recessed toward the lower side Z2 is formed in the upper surface of the article 2 (here, an upper surface of the supported portion 2*a*). The holder 10 includes a fitting portion 13 that fits into the recessed portion 2*b* from the upper side Z1 for positioning the holder 10 relative to the article 2 in the horizontal direction. In the illustrated example, the fitting portion 13 has a truncated cone shape whose diameter decreases toward the lower side Z2. The fitting portion 13 is fixed to a lower end of a movable member 12 (here, a rod-shaped member extending in the up-down direction Z) included in the holder 10. The movable member 12 is movable in the up-down direction Z relative to the holder 10 (specifically, movable in the up-down direction Z relative to a body of the holder 10). Here, the body of the holder 10 is a portion that is coupled to a belt 22, which will be described later, or in other words, a portion that is raised and lowered together with the supporting members 11. While the fitting portion 13 is spaced apart from the article 2, the movable member 12 is at a lower limit position of a movable range of the movable member 12 in the up-down direction Z and is biased toward the lower side Z2 (see FIG. 5(*a*)). While the fitting portion 13 is in contact with the article 2 (specifically, while the fitting portion 13 fits in the recessed portion 2*b*), the movable member 12 moves toward the upper side Z1 relative to the holder 10 against the biasing force acting toward the lower side Z2, as a distance between the holder 10 and the article 2 in the up-down direction Z decreases (see FIGS. 5(*b*) and 5(*c*)). That is, the amount of relative movement of the movable member 12 from the above-described lower limit position toward the upper side Z1 increases as the distance between the holder 10 and the article 2 in the up-down direction Z decreases.

The body 44 includes the elevating device 20 that raises and lowers the holder 10. As shown in FIG. 2, the elevating device 20 includes a drum 21, a belt 22 that is wound around the drum 21 in such a manner as to be capable of being unwound from the drum 21 and wound around the drum 21, a drive motor 23 (for example, an electric motor such as a servomotor) that drives the drum 21 to rotate, and a transmission mechanism 24 that transmits driving force from the drive motor 23 to the drum 21. An end of the belt 22 is fixed to the drum 21 (see FIG. 4), and the other end of the belt 22 (an end portion unwound from the drum 21) is coupled to the holder 10 (see FIGS. 1 and 2). In the present embodiment, the transmission mechanism 24 is configured to transmit rotation of the drive motor 23 to the drum 21 while decelerating the rotation speed. The transmission mechanism 24 includes a pair of gears that are separately provided on two parallel shafts and mesh with each other, for example. Although description of details is omitted, the elevating device 20 may also include a pulley that changes an extending direction of a portion of the belt 22 unwound from the drum 21.

The elevating device 20 unwinds the belt 22 from the drum 21 by rotating the drum 21 in a rotation direction with use of the drive motor 23, and winds the belt 22 around the drum 21 by rotating the drum 21 in the opposite rotation direction with use of the drive motor 23. While the holder 10 is suspended with the belt 22, the elevating device 20 lowers the holder 10 by unwinding the belt 22 from the drum 21, and raises the holder 10 by winding the belt 22 around the drum 21. As described above, the elevating device 20 raises and lowers the holder 10 by rotating the drum 21 with use of the drive motor 23. As shown in FIG. 2, in the present embodiment, the elevating device 20 includes three drums 21, and belts 22 are respectively wound around the three drums 21. The elevating device 20 rotates the three drums 21 with use of the drive motor 23 to raise and lower the holder 10.

When the article transport vehicle 40 performs a travel operation of traveling along the travel path, the holder 10 is arranged at a reference height HS (see FIGS. 1 and 2). The reference height HS is an upper limit position of a range in which the holder 10 is raised and lowered by the elevating device 20 (in other words, a height of the holder 10 in a state where the belt 22 is wound around the drum 21 as far as possible), for example. In the present embodiment, when the holder 10 is at the reference height HS, an article 2 held by the holder 10 is housed in the body 44. The article 2 held by the holder 10 at the reference height HS is in an inside space (here, a space that is closed at least on both sides in the path longitudinal direction X) of a cover portion 45 included in the body 44.

When the article transport vehicle 40 performs a transfer operation of transferring an article 2 between the holder 10 and a transfer target position 6, the holder 10 is arranged at a target height H0 corresponding to the transfer target position 6 (see FIG. 1). That is, the holder 10 performs operations for holding the article 2 and releasing the article 2 while being arranged at the target height H0. The target height H0 is lower than the reference height HS. The target height H0 is set in accordance with the height of the transfer target position 6 (specifically, a placement portion 7 that is provided at the transfer target position 6 and on which the article 2 is placed). FIG. 1 shows a case where there are a plurality of placement portions 7 for placement of the article 2 at different heights, and a plurality of different target heights H0 are set in accordance with the heights of the placement portions 7. FIG. 1 shows load ports that are adjacent to processing devices 5, as examples of the placement portions 7. Articles 2 are processing targets for the processing devices 5, and substrates taken out of the articles 2 are processed by the processing devices 5 in the present embodiment.

Operations of the article transport vehicle 40 are controlled by the controller (see FIG. 3). The controller 30 includes an arithmetic processing device such as a CPU and a peripheral circuit such as a memory, and functions of the controller 30 are realized through cooperation between these hardware pieces and a program executed by hardware such as the arithmetic processing device. The controller 30 may be included in the article transport vehicle 40 or may be provided independently of the article transport vehicle 40. In a case where the controller 30 includes a plurality of separate hardware pieces that can communicate with each other, a configuration is also possible in which some hardware pieces are included in the article transport vehicle 40 and the rest of the hardware pieces are provided independently of the article transport vehicle 40.

Various technical features of the controller 30 described below can also be applied to a method for controlling the article transport vehicle 40 (for example, the elevating device 20, the same applies hereinafter) and a program for controlling the article transport vehicle 40, and such a method and a program, and a recording medium (a computer-readable recording medium such as an optical disk or a flash memory) on which the program is recorded are also disclosed in the present specification. The program for controlling the article transport vehicle 40 is provided as a recording medium on which the program is recorded, for example, or is provided via a communication network, and the provided program is stored in a storage device that the controller 30 (computer) can refer to.

The controller 30 controls the elevating device 20. Specifically, the controller controls the drive motor 23 to cause the elevating device 20 to perform a lowering operation of lowering the holder 10 and a raising operation of raising the holder 10. In the present embodiment, the controller 30 further controls the holder 10 and the travel sections 41. Specifically, the controller 30 controls the holding motor 14 (see FIG. 2, omitted in FIG. 3) to cause the holder 10 to perform the holding operation of holding an article 2 and the releasing operation of releasing an article 2. Also, the controller 30 controls the travel motors 42 (see FIG. 2, omitted in FIG. 3) to cause the travel sections 41 to perform the travel operation of traveling along the travel path.

When an article 2 is to be transferred between the holder 10 and a placement portion 7, the controller 30 causes the article transport vehicle 40 to travel to a position corresponding to the placement portion 7 by causing the travel sections 41 to perform the travel operation. In the present embodiment, the position corresponding to the placement portion 7 is a position that is on the upper side Z1 with respect to the placement portion 7 and at which the body 44 overlaps the placement portion 7 in a plan view (as viewed along the up-down direction Z). When the article 2 is to be transferred from the holder 10 to the placement portion 7, the controller 30 causes the elevating device 20 to perform the lowering operation of lowering the holder 10 that is in a holding state of holding the article 2 from the reference height HS to the target height H0, thereafter causes the holder 10 to perform the releasing operation of releasing the article 2, and then causes the elevating device 20 to perform the raising operation of raising the holder 10 from the target height H0 to the reference height HS. When the article 2 is to be transferred from the placement portion 7 to the holder 10, the controller 30 causes the elevating device 20 to perform the lowering operation of lowering the holder 10 that is in a non-holding state of not holding the article 2 from the reference height HS to the target height H0, thereafter causes the holder 10 to perform the holding operation of holding the article 2, and then causes the elevating device 20 to perform the raising operation of raising the holder 10 from the target height H0 to the reference height HS.

There is a correlation between a rotation amount of the drive motor 23 and an elevation amount of the holder 10, and the controller 30 controls the elevation amount of the holder 10 based on the rotation amount of the drive motor 23. That is, the controller 30 controls the elevation amount of the holder 10 by controlling the rotation amount of the drive motor 23. In the present embodiment, the controller 30 controls the rotation amount of the drive motor 23 by performing feedback control based on a detection value of the rotation amount of the drive motor 23. Here, the drive motor 23 is provided with an encoder that outputs a pulse every time the drive motor 23 rotates by a unit rotation amount, and the controller 30 detects the rotation amount of the drive motor 23 based on the number of pulses output from the encoder. As described above, in the present embodiment, the controller 30 controls the rotation amount of the drive motor 23 based on the number of pulses corresponding to the unit rotation amounts (a pulse count according to which one pulse corresponds to the unit rotation amount).

Figure 4:
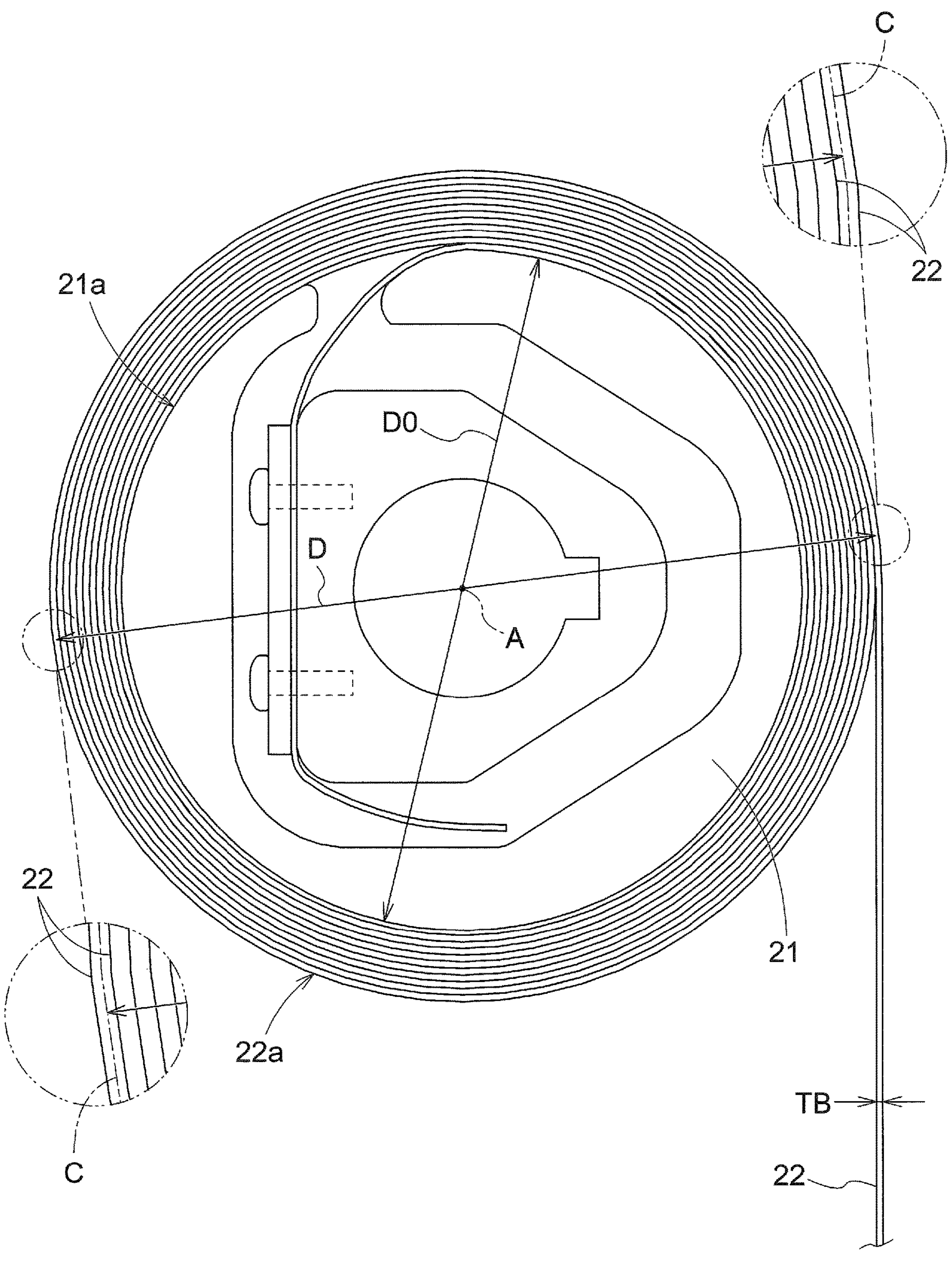
FIG. 4 is a diagram showing a drum according to an embodiment.

Incidentally, each belt 22 is wound around the corresponding drum 21 in such a manner that turns of the belt 22 are overlaid on one another as shown in FIG. 4. Accordingly, a winding diameter that is the diameter of an outer circumferential surface 22*a* of the belt 22 wound around the drum 21 gradually decreases as the belt 22 is unwound from the drum 21, and gradually increases as the belt 22 is wound around the drum 21. That is, the winding diameter of the belt 22 varies depending on the height of the holder 10. Note that a belt center diameter D (which will be described later) shown in FIG. 4 is obtained by subtracting a thickness TB of the belt 22 from the winding diameter of the belt 22. Such a change in the winding diameter of the belt 22 may be a cause of an error in the elevation amount of the holder 10 (a difference from a target elevation amount) in the case where the elevation amount of the holder 10 is controlled based on the rotation amount of the drive motor 23 as described above. The following describes a technology for suppressing such an error in the elevation amount of the holder 10 according to the present disclosure.

Here, an elevation amount of the holder 10 per unit rotation amount of the drive motor 23 will be referred to as a "unit elevation amount". As described above, in the present embodiment, the controller 30 is configured to control the rotation amount of the drive motor 23 based on the number of pulses corresponding to the unit rotation amounts. Accordingly, in the present embodiment, the unit elevation amount represents a pulse ratio (an elevation amount of the holder 10 per pulse). While the controller 30 performs an elevation operation that is at least either an operation of lowering the holder 10 or an operation of raising the holder 10, the controller 30 calculates the unit elevation amount in an elevation operation range that is a range of heights of the holder 10 in the elevation operation, in accordance with a change in the winding diameter of the belt 22 due to winding and unwinding of the belt 22 (specifically, winding of the belt 22 around the drum 21 and unwinding of the belt 22 from the drum 21). A method for calculating the unit elevation amount will be described later. Then, the controller 30 determines a rotation amount of the drive motor 23 for the elevation operation based on the calculated unit elevation amount. In the following description, an elevation operation for which the rotation amount of the drive motor 23 is determined as described above will be referred to as a "specific elevation operation", and an elevation operation that is not the specific elevation operation will be referred to as a "non-specific elevation operation". When the holder performs the non-specific elevation operation, the controller 30 determines a rotation amount of the drive motor 23 for the non-specific elevation operation based on a learning result regarding the rotation amount of the drive motor 23, for example.

The holder 10 performs at least the specific elevation operation out of the specific elevation operation and the non-specific elevation operation. In the following situations shown in FIGS. 5 to 7, the holder 10 performs both the specific elevation operation and the non-specific elevation operation. FIGS. 5 to 7 show situations in which the holder 10 is lowered from the reference height HS (see FIGS. 1 and 2) to the target height H0. In FIGS. 5 and 6, an elevation operation of the holder 10 performed until a point in time at which the holder 10 reaches a first height H1 is the non-specific elevation operation, and an elevation operation of the holder 10 performed from that point in time is the specific elevation operation. In FIG. 7, an elevation operation of the holder 10 performed until a point in time at which the holder 10 reaches a second height H2 is the non-specific elevation operation, and an elevation operation of the holder 10 performed from that point in time is the specific elevation operation. The following specifically describes the situations shown in FIGS. 5 to 7 in order.

FIG. 5 shows situations in which the holder 10 that is in the non-holding state of not holding an article 2 is lowered and a receiving operation of holding an article 2 placed on a placement portion 7 (see FIG. 1) with the holder 10 is performed, and FIGS. 5(*a*), 5(*b*), 5(*c*), and 5(*d*) show the situations at respective points in time in chronological order. FIGS. 5(*c*) and 5(*d*) show states where the holder 10 in the non-holding state is performing the holding operation of holding the article 2 placed on the placement portion 7 (here, an operation of bringing the pair of supporting portions 11*a* closer to each other to place each of the supporting portions 11*a* on the lower side Z2 of the supported portion 2*a*). A relative distance between the holder 10 and the article 2 in the up-down direction Z while the holder 10 in the non-holding state is at a position where the holder 10 can perform the holding operation as described above will be referred to as a holding enabled distance L. In the present embodiment, the holding enabled distance L is the relative distance between the holder 10 and the article 2 in the up-down direction Z while the holder 10 is at a position where the holder 10 can perform the holding operation without bringing the supporting members 11 (including the supporting portions 11*a*) into contact with the article 2. The holding enabled distance L may have a certain range. In FIG. 5, the height of the upper surface of the article 2 (here, the upper surface of the supported portion 2*a*) is shown as a fourth height H4, and the height of the holder 10 when the holder 10 is on the upper side Z1 with respect to the article 2 and the relative distance between the holder 10 and the article 2 is the holding enabled distance L is shown as the target height H0.

As shown in FIG. 5, in the present embodiment, the holder 10 includes a first sensor 51 that detects the article 2 at a position spaced apart from the article 2 by a distance equal to the sum of the holding enabled distance L and a first distance L1 on the upper side Z1 with respect to the article 2. The "position" referred to here is the position of the holder 10. In FIG. 5, a height higher than (on the upper side Z1 of) the target height H0 by the first distance L1 is shown as the first height H1. As shown in FIG. 5(*b*), the first sensor 51 detects the article 2 while the holder 10 is at the first height H1.

In the present embodiment, the first sensor 51 is configured to detect that the relative distance between the holder 10 and the article 2 in the up-down direction Z is not larger than a "first target distance" that is equal to the sum of the holding enabled distance L and the first distance L1. Accordingly, the first sensor 51 detects the article 2 at a position spaced apart from the article 2 by the first target distance on the upper side Z1 with respect to the article 2 and at positions on the lower side Z2 of that position. Note that a configuration is also possible in which the first sensor 51 detects the article 2 only at the position spaced apart from the article 2 by the first target distance on the upper side Z1 with respect to the article 2, or at the position spaced apart from the article 2 by the first target distance on the upper side Z1 with respect to the article 2 and at positions within a prescribed range from that position on the lower side Z2 of that position.

In the example shown in FIG. 5, the first sensor 51 detects that the relative distance between the holder 10 and the article 2 in the up-down direction Z is not larger than the first target distance by detecting the movable member 12 that moves toward the upper side Z1 relative to the holder 10 as the relative distance decreases. An example of the first sensor 51 is an optical sensor that detects the presence or absence of the movable member 12 (specifically, a detection target portion included in the movable member 12). In the example shown in FIG. 5, the detection target portion is a rod-shaped portion of the movable member 12 extending in the up-down direction Z, but the detection target portion may also be a dog or the like provided in the movable member 12.

In FIG. 5, the first sensor 51 detecting the movable member 12 is shown in black, and the first sensor 51 not detecting the movable member 12 is outlined. While the relative distance between the holder 10 and the article 2 in the up-down direction Z is larger than the first target distance as shown in FIG. 5(*a*), the movable member 12 is not detected by the first sensor 51. On the other hand, in a state where the relative distance is equal to the first target distance as shown in FIG. 5(*b*) and a state where the relative distance is smaller than the first target distance as shown in FIGS. 5(*c*) and 5(*d*), the movable member 12 is detected by the first sensor 51.

When the receiving operation is to be performed, the controller 30 gradually brings the holder 10 in the non-holding state closer to the article 2 placed on the placement portion 7 (see FIG. 1) from the upper side Z1 as shown in FIG. 5(*a*). The movable member 12 descends together with the holder 10 until the fitting portion 13 fits in the recessed portion 2*b*, and after the fitting portion 13 fits in the recessed portion 2*b*, only the holder 10 descends and the movable member 12 moves toward the upper side Z1 relative to the holder 10. When the holder 10 has descended to the first height H1 as shown in FIG. 5(*b*), the movable member 12 is detected by the first sensor 51 (that is, the article 2 is detected by the first sensor 51). The position of the holder shown in FIG. 5(*b*) is the position at which the article 2 is detected by the first sensor 51.

The controller 30 causes the elevating device 20 to perform a first operation of lowering the holder 10 by the first distance L1 from the position at which the article 2 is detected by the first sensor 51. As a result of the first operation being executed, the holder 10 descends from the first height H1 to the target height H0 as shown in FIG. 5(*c*). Then, the controller 30 causes the holder 10 to perform the holding operation (here, an operation of bringing the pair of supporting portions 11*a* closer to each other to place each of the supporting portions 11*a* on the lower side Z2 of the supported portion 2*a*) at the position of the holder 10 in the up-down direction Z at which the first operation is completed as shown in FIG. 5(*d*). After the holding operation is completed, the controller 30 causes the elevating device 20 to perform a raising operation (not shown) of raising the holder 10 from the target height H0 to the reference height HS. As a result, the holder 10 moves upward to the reference height HS while holding the article 2.

The first operation described above is included in the elevation operation (the specific elevation operation). Accordingly, the controller 30 calculates a unit elevation amount in the elevation operation range in which the first operation is performed, and determines a rotation amount of the drive motor 23 for the first operation based on the unit elevation amount. In the example shown in FIG. 5, the height range between the target height H0 and the first height H1 is the elevation operation range in which the first operation is performed. As in the example shown in FIG. 1, there may be a plurality of placement portions 7 for placement of the article 2 at different heights. According to the present embodiment, in such a case, the controller 30 sets the elevation operation range (for example, the height range between the target height H0 and the first height H1) for each of the placement portions 7 at different heights, and calculates the unit elevation amount corresponding to the set elevation operation range.

In the present embodiment, the controller 30 determines the rotation amount of the drive motor 23 by dividing a target elevation amount of the holder 10 in the elevation operation (the specific elevation operation) by the unit elevation amount. As described above, in the present embodiment, the unit elevation amount is a pulse ratio (an amount by which the holder 10 is raised or lowered per pulse), and accordingly, the rotation amount of the drive motor 23 is expressed as the number of pulses (pulse count). In the example shown in FIG. 5, the target elevation amount of the holder 10 in the first operation is a height difference between the first height H1 and the target height H0, and the rotation amount of the drive motor 23 for the first operation is determined by dividing the height difference by the unit elevation amount.

Next, situations shown in FIG. 6 will be described. Similarly to FIG. 5, FIG. 6 shows situations in which the receiving operation is performed, and FIGS. 6(*a*), 6(*b*), 6(*c*), and 6(*d*) show the situations at respective points in time in chronological order. Unlike FIG. 5, FIG. 6 shows a case where the holder 10 descends past the position at which the relative distance between the holder 10 and the article 2 is the holding enabled distance L for some reason (for example, deterioration of the belt 22 over time) (in other words, a case where the holder 10 descends to the lower side Z2 of the target height H0).

As shown in FIG. 6, in the present embodiment, the holder 10 includes a third sensor 53 that detects a specific state in which the holder 10 has reached a position spaced apart from the article 2 by a distance equal to a difference between the holding enabled distance L and a third distance L3 on the upper side Z1 with respect to the article 2. When the distance equal to the difference between the holding enabled distance L and the third distance L3 is referred to as a "third target distance", the position spaced apart from the article 2 by the third target distance on the upper side Z1 with respect to the article 2 is set in such a manner that the supporting members 11 (including the supporting portions 11*a*) do not come into contact with the article 2 when the holder 10 is at this position. In FIG. 6, the height of the holder 10 when the holder 10 is on the upper side Z1 with respect to the article 2 and the relative distance between the holder 10 and the article 2 is the third target distance is shown as a third height H3. The third sensor 53 detects the state in which the holder 10 has descended to the third height H3 as shown in FIG. 6(*c*) as the specific state.

In the present embodiment, the third sensor 53 is configured to detect that the relative distance between the holder 10 and the article 2 in the up-down direction Z is not larger than the third target distance. Accordingly, the third sensor 53 detects the specific state at the position spaced apart from the article 2 by the third target distance on the upper side Z1 with respect to the article 2 and at positions on the lower side Z2 of that position. Note that a configuration is also possible in which the third sensor 53 detects the specific state only at the position spaced apart from the article 2 by the third target distance on the upper side Z1 with respect to the article 2, or at the position spaced apart from the article 2 by the third target distance on the upper side Z1 with respect to the article 2 and at positions within a prescribed range from that position on the lower side Z2 of that position.

In the example shown in FIG. 6, the third sensor 53 detects that the relative distance between the holder 10 and the article 2 in the up-down direction Z is not larger than the third target distance by detecting the movable member 12 that moves toward the upper side Z1 relative to the holder 10 as the relative distance decreases. An example of the third sensor 53 is an optical sensor that detects the presence or absence of the movable member 12 (specifically, a detection target portion included in the movable member 12). In the example shown in FIG. 6, the detection target portion is a rod-shaped portion of the movable member 12 extending in the up-down direction Z, but the detection target portion may also be a dog or the like provided in the movable member 12. In the example shown in FIG. 6, the third sensor 53 is on the upper side Z1 with respect to the first sensor 51, but a configuration is also possible in which the first sensor 51 and the third sensor 53 are provided at the same height and detect different detection target portions of the movable member 12 (for example, different dogs).

In FIG. 6, the third sensor 53 detecting the specific state is shown in black, and the third sensor 53 not detecting the specific state is outlined. While the relative distance between the holder 10 and the article 2 in the up-down direction Z is larger than the third target distance as shown in FIGS. 6(*a*), 6(*b*), and 6(*d*), the movable member 12 is not detected by the third sensor 53. On the other hand, in a state where the relative distance is equal to the third target distance as shown in FIG. 6(*c*) and a state (not shown) where the relative distance is smaller than the third target distance, the movable member 12 is detected by the third sensor 53.

Similarly to FIG. 5(*a*), FIG. 6(*a*) shows a state where the holder 10 in the non-holding state is brought closer to the article 2 placed on the placement portion 7 from the upper side Z1. Similarly to FIG. 5(*b*), FIG. 6(*b*) shows a state where the holder 10 has descended to the first height H1 and the article 2 is detected by the first sensor 51. The controller 30 causes the elevating device 20 to perform the first operation of lowering the holder 10 by the first distance L1 from the position at which the article 2 is detected by the first sensor 51 as shown in FIG. 5(*c*), but in this case, the holder 10 descends to the third height H3 that is on the lower side Z2 of the target height H0 as shown in FIG. 6(*c*). As a result, the movable member 12 is detected by the third sensor 53 (that is, the specific state is detected by the third sensor 53). The position of the holder 10 shown in FIG. 6(*c*) is the position at which the specific state is detected by the third sensor 53.

In response to the specific state being detected by the third sensor 53 while the holder 10 in the non-holding state is gradually brought closer to the article 2 on the placement portion 7 from the upper side Z1, the controller 30 causes the elevating device 20 to perform a third operation of raising the holder 10 by the third distance L3 from the position at which the specific state is detected by the third sensor 53. As a result of the third operation being executed, the holder 10 moves upward from the third height H3 to the target height H0 as shown in FIG. 6(*d*). Then, the controller 30 causes the holder 10 to perform the holding operation at the position of the holder 10 in the up-down direction Z at which the third operation is completed, and thereafter causes the elevating device 20 to perform a raising operation of raising the holder 10 from the target height H0 to the reference height HS, although illustration of these operations is omitted. As a result, the holder 10 moves upward to the reference height HS while holding the article 2.

The third operation described above is included in the elevation operation (the specific elevation operation). Accordingly, the controller 30 calculates a unit elevation amount in the elevation operation range in which the third operation is performed, and determines a rotation amount of the drive motor 23 for the third operation based on the unit elevation amount. In the example shown in FIG. 6, the height range between the third height H3 and the target height H0 is the elevation operation range in which the third operation is performed. In the example shown in FIG. 6, a target elevation amount of the holder 10 in the third operation is a height difference between the third height H3 and the target height H0, and the rotation amount of the drive motor 23 for the third operation is determined by dividing the height difference by the unit elevation amount.

Next, situations shown in FIG. 7 will be described. FIG. 7 shows situations in which the holder 10 that is in the holding state of holding an article 2 is lowered and a transfer operation of transferring the article 2 to the placement portion 7 (see FIG. 1) is performed, and FIGS. 7(*a*), 7(*b*), 7(*c*), and 7(*d*) show the situations at respective points in time in chronological order.

As shown in FIGS. 7(*a*) and 7(*b*), in the present embodiment, the holder 10 includes a second sensor 52 that detects whether the holder 10 is (i) in a supporting state of supporting an article 2 with the supporting members 11 or (ii) in a non-supporting state of not supporting an article 2 with the supporting members 11. An example of the second sensor 52 is a pressure sensitive sensor provided on the supporting portions 11*a* of the supporting members 11. In FIGS. 7(*a*) and 7(*b*), the second sensor 52 detecting the supporting state is shown in black, and the second sensor 52 detecting the non-supporting state is outlined.

When the transfer operation is to be performed, the controller 30 gradually brings the holder 10 in the holding state closer to the placement portion 7 (see FIG. 1) on which the article 2 is to be placed, from the upper side Z1 as shown in FIG. 7(*a*). The supporting members 11 descend together with the article 2 while supporting the article 2 until the article 2 is placed on the placement portion 7. After the article 2 is placed on the placement portion 7, only the supporting members 11 descend and enter the state of not supporting the article 2, and accordingly, the second sensor 52 detects the transition from the supporting state to the non-supporting state. Here, the second sensor 52 detects the transition from the supporting state to the non-supporting state when the holder 10 has descended to a second height H2 that is higher than (on the upper side Z1 of) the target height H0 by a second distance L2 as shown in FIG. 7(*b*).

The controller 30 causes the elevating device 20 to perform a second operation of lowering the holder 10 by the second distance L2 from the position at which the transition from the supporting state to the non-supporting state is detected by the second sensor 52 as a result of the article 2 being placed on the placement portion 7. As a result of the second operation being executed, the holder 10 descends from the second height H2 to the target height H0 as shown in FIG. 7(*c*). Then, as shown in FIG. 7(*d*), the controller 30 causes the holder 10 to perform the releasing operation of retracting the supporting members 11 from the lower side Z2 of the supported portion 2*a* (here, an operation of moving the pair of supporting portions 11*a* away from each other to retract each of the supporting portions 11*a* from the lower side Z2 of the supported portion 2*a*) at the position of the holder 10 in the up-down direction Z at which the second operation is completed. After the releasing operation is completed, the controller 30 causes the elevating device 20 to perform a raising operation (not shown) of raising the holder 10 from the target height H0 to the reference height HS. As a result, the holder 10 leaves the article 2 on the placement portion 7 and moves upward to the reference height HS.

The second operation described above is included in the elevation operation (the specific elevation operation). Accordingly, the controller 30 calculates a unit elevation amount in the elevation operation range in which the second operation is performed, and determines a rotation amount of the drive motor 23 for the second operation based on the unit elevation amount. In the example shown in FIG. 7, the height range between the second height H2 and the target height H0 is the elevation operation range in which the second operation is performed. In the example shown in FIG. 7, a target elevation amount of the holder 10 in the second operation is a height difference between the second height H2 and the target height H0, and the rotation amount of the drive motor 23 for the second operation is determined by dividing the height difference by the unit elevation amount.

Although description of details is omitted, the holder 10 may descend to the lower side Z2 of the target height H0 also in the case where the transfer operation is performed as shown in FIG. 7. In such a case, the controller 30 causes the elevating device 20 to perform the third operation described above, and therefore, it is possible to cause the holder 10 to perform the releasing operation at the target height H0.

Next, a method for calculating the unit elevation amount will be described. In the present embodiment, the controller 30 calculates the unit elevation amount with use of the following formula (1).

$$PR=\pi/(RL\times PP)^2\times(RL\times PP\times DL-2\times TB\times UP) \quad (1)$$

Here, PR is the unit elevation amount. The unit elevation amount calculated with use of the formula (1) is a pulse ratio (an amount by which the holder 10 is raised or lowered per pulse). RL is a ratio of the rotation amount of the drive motor 23 to the rotation amount of the drum 21. In the present embodiment, rotation of the drive motor 23 is transmitted to the drum 21 by the transmission mechanism 24 while being decelerated, and therefore, RL is a value larger than 1 (i.e., a reduction ratio). PP is a pulse count corresponding to one full rotation of the drive motor 23. In the present embodiment, PP is the number of pulses output from the encoder during one full rotation of the drive motor 23. DL is a belt center diameter D while the holder 10 is at the reference height HS. As shown in FIG. 4, the belt center diameter D is a diameter at a thickness center C of the outermost turn of the belt 22 wound around the drum 21. The thickness center C is the center position of the belt 22 in its thickness direction. That is, DL is a value obtained by subtracting the thickness TB of the belt 22 from a winding diameter (the diameter of the outer circumferential surface 22*a* of the belt 22) while the holder 10 is at the reference height HS. In the present embodiment, the reference height HS is the upper limit position of the range in which the holder 10 is raised and lowered by the elevating device 20 (see FIGS. 1 and 2). TB is the thickness of the belt 22. UP is a pulse count corresponding to a rotation amount of the drive motor 23 required to raise or lower (in this case, lower) the holder 10 from the reference height HS to a height included in the elevation operation range in which the elevation operation (the specific elevation operation) is performed. Here, the "height included in the elevation operation range in which the elevation operation is performed" may be the upper limit height of the elevation operation range, the lower limit height of the elevation operation range, an intermediate height (for example, the middle height) of the elevation operation range, the height of the holder 10 at the start of the elevation operation, or the height of the holder 10 at the end of the elevation operation, for example. Also, UP (the pulse count) may be a value that is based on an actual measurement result (learning result).

As described above, the elevation operation range in which the first operation is performed in the example shown in FIG. 5 is the height range between the target height H0 and the first height H1, the elevation operation range in which the third operation is performed in the example shown in FIG. 6 is the height range between the target height H0 and the third height H3, and the elevation operation range in which the second operation is performed in the example shown in FIG. 7 is the height range between the target height H0 and the second height H2. In cases where the target height H0 is included in the elevation operation range in which the elevation operation (the specific elevation operation) is performed as described above, UP may be a pulse count corresponding to a rotation amount of the drive motor 23 required to raise or lower (in this case, lower) the holder 10 from the reference height HS to the target height H0, for example.

The formula (1) shown above can be obtained as described below. The unit elevation amount (PR) is expressed by the following formula (2) with use of the belt center diameter D.

$$PR=\pi\times D/(RL\times PP) \quad (2)$$

A relationship between the belt center diameter D and the number of turns of the belt 22, which is represented by M, at a given elevation position is expressed by the following formula (3) with use of a drum diameter D0 (see FIG. 4) that is the diameter of an outer circumferential surface 21*a* of the drum 21 and the thickness TB of the belt 22 (see FIG. 4).

$$D=D0+TB\times(2\times M-1) \quad (3)$$

A relationship between the number (M) of turns of the belt 22 and the pulse count (UP) described above is expressed by the following formula (4) in which ML represents the number of turns of the belt 22 in the state where the holder 10 is at the reference height HS.

$$M=ML-UP/(RL\times PP) \quad (4)$$

DL, which is the belt center diameter D in the state where the holder 10 is at the reference height HS, is expressed by the following formula (5).

$$DL=D0+TB\times(2\times ML-1) \quad (5)$$

When the formula (2) is transformed with use of the formulas (3) to (5), the formula (1) is obtained.

The formula (1) shown above can also be obtained as described below. Here, the length of a portion of the belt 22 unwound from the drum 21, which changes according to the belt center diameter D, is represented by S. The area of a cross section of this portion orthogonal to a rotation axis A of the drum 21 while the portion is wound around the drum 21 is expressed approximately as $\pi\times(DL/2)^2-\pi\times(D/2)^2$, and when it is assumed that this cross-sectional area is equal to a product S×TB of the length (S) of this portion and the thickness TB of the belt 22, the following formula (6) holds.

$$S=\pi\times(DL^2-D^2)/(4\times TB) \quad (6)$$

When the formula (6) is transformed with use of the formulas (3) to (5), the following formula (7) is obtained. When the right side of the formula (7) is differentiated with respect to UP, the formula (1) is obtained.

$$S=\pi/(RL\times PP)^2\times(RL\times PP\times DL\times UP-TB\times UP^2) \quad (7)$$

Other Embodiments (1) In the above embodiment, a configuration is described as an example in which the controller 30 controls the rotation amount of the drive motor 23 based on the number of pulses output from the encoder. However, there is no limitation to this configuration with which the controller 30 controls the rotation amount of the drive motor 23 based on the number of pulses corresponding to unit rotation amounts, and a configuration is also possible in which the drive motor 23 is configured to rotate by a rotation amount corresponding to the number of pulses that are input, and the controller 30 controls the rotation amount of the drive motor 23 based on the number of pulses input to the drive motor 23, for example. In this case, a rotation amount of the drive motor 23 per pulse is referred to as the "unit rotation amount", and the number of pulses input to the drive motor 23 is "the number of pulses corresponding to unit rotation amounts (a pulse count according to which one pulse corresponds to the unit rotation amount)".

(2) In the above embodiment, a configuration is described as an example in which the article elevating device 1 is movable in the horizontal direction. However, the present disclosure is not limited to this configuration, and a configuration is also possible in which the article elevating device 1 is not movable in the horizontal direction.

(3) The configurations disclosed in the above embodiment can also be applied in combination with the configurations disclosed in the other embodiments (also, the embodiments described as the other embodiments may be combined with each other) so long as no contradiction arises. The embodiments disclosed in the present specification including the other configurations are merely examples in all aspects. Therefore, various modifications can be made as appropriate within a scope not departing from the spirit of the present disclosure.

[Outline of Above Embodiment]

The following describes an outline of the article elevating device described above.

An article elevating device including: a holder configured to hold an article; an elevating device configured to raise and lower the holder; and a controller configured to control the elevating device, wherein the elevating device includes a drum, a belt that is wound around the drum in such a manner as to be capable of being unwound from the drum and wound around the drum, a drive motor configured to drive the drum to rotate, and a transmission mechanism configured to transmit driving force from the drive motor to the drum, the elevating device lowers the holder by unwinding the belt from the drum and raises the holder by winding the belt around the drum, while the holder is suspended with the belt, and while the controller performs an elevation operation that is at least either an operation of lowering the holder or an operation of raising the holder, the controller (i) calculates a unit elevation amount, which is an amount by which the holder is raised or lowered per unit rotation amount of the drive motor in an elevation operation range that is a range of heights of the holder in the elevation operation, in accordance with a change in a diameter of an outer circumferential surface of the belt wound around the drum due to winding of the belt and unwinding of the belt, and (ii) determines a rotation amount of the drive motor for the elevation operation based on the unit elevation amount.

With this configuration, when an elevation operation of the holder is to be performed, the unit elevation amount in the elevation operation range in which the elevation operation is performed can be calculated in accordance with a change in a winding diameter, or the diameter of the outer circumferential surface of the belt wound around the drum due to winding of the belt and unwinding of the belt. Then, the rotation amount of the drive motor for the elevation operation of the holder can be determined based on the unit elevation amount calculated as described above. Accordingly, even in a case where the elevation operation range changes every time an elevation operation of the holder is performed, for example, it is possible to appropriately determine the rotation amount of the drive motor for each elevation operation of the holder with use of the unit elevation amount corresponding to the elevation operation range of that operation. Therefore, it is possible to suppress an error in the elevation amount of the holder due to a change in the winding diameter of the belt, and improve precision of the elevation operation of the holder.

Here, it is preferable that the controller determines the rotation amount of the drive motor by dividing a target elevation amount of the holder in the elevation operation by the unit elevation amount.

With this configuration, it is possible to determine the rotation amount of the drive motor appropriately in such a manner that an actual elevation amount of the holder in the elevation operation is equal to the target elevation amount.

In the configuration described above, it is preferable that the controller controls the rotation amount of the drive motor based on a pulse count according to which one pulse corresponds to the unit rotation amount, and the controller calculates the unit elevation amount with use of the following formula (1), $$PR=\pi/(RL\times PP)^2\times(RL\times PP\times DL-2\times TB\times UP) \quad (1)$$

where PR is the unit elevation amount, RL is a ratio of the rotation amount of the drive motor to a rotation amount of the drum, PP is a pulse count corresponding to one full rotation of the drive motor, DL is a diameter at a thickness center of an outermost turn of the belt wound around the drum while the holder is at a reference height, TB is a thickness of the belt, and UP is a pulse count corresponding to a rotation amount of the drive motor required to raise or lower the holder from the reference height to a height included in the elevation operation range.

Out of the parameters on the right side of the formula (1), parameters other than UP are constants that are determined according to the configuration of the article elevating device. Therefore, with this configuration, it is possible to improve precision of the elevation operation of the holder while suppressing a load of computation processing for calculating the unit elevation amount in the elevation operation range in which the elevation operation of the holder is performed.

In each configuration described above, it is preferable that the holder includes a first sensor configured to detect the article at a position spaced above the article by a distance equal to a sum of a holding enabled distance and a first distance, the holding enabled distance being a relative distance between the holder and the article in an up-down direction while the holder that is in a non-holding state of not holding the article is at a position where the holder is capable of performing a holding operation of holding the article placed on at least one placement portion, the controller gradually brings the holder in the non-holding state closer to the article on the at least one placement portion from above, causes the elevating device to perform a first operation of lowering the holder by the first distance from a position at which the article is detected by the first sensor, and causes the holder to perform the holding operation at a position in the up-down direction at which the first operation is completed, and the elevation operation includes the first operation.

With this configuration, when the holder in the non-holding state is lowered to perform the receiving operation of holding the article placed on a placement portion, it is possible to determine the rotation amount of the drive motor in the first operation in such a manner that an actual lowering amount of the holder in the first operation is equal to the first distance. Therefore, when the receiving operation is to be performed, it is possible to precisely lower the holder in the first operation to a position at which the relative distance between the article and the holder is the holding enabled distance, and cause the holder to appropriately perform the holding operation of holding the article.

Also, it is preferable that the holder includes: a supporting member configured to support a supported portion of the article from below; and a second sensor configured to detect whether the holder is (i) in a supporting state of supporting the article with the supporting member or (ii) in a non-supporting state of not supporting the article with the supporting member, the controller gradually brings the holder that is in a holding state of holding the article closer to a placement portion for placement of the article from above, causes the elevating device to perform a second operation of lowering the holder by a second distance from a position where transition from the supporting state to the non-supporting state is detected by the second sensor as a result of the article being placed on the placement portion, and causes the holder to perform a releasing operation of retracting the supporting member from below the supported portion at a position in an up-down direction at which the second operation is completed, and the elevation operation includes the second operation.

With this configuration, when the holder in the holding state is lowered to perform the transfer operation of transferring the article to the placement portion, it is possible to determine the rotation amount of the drive motor in the second operation in such a manner that an actual lowering amount of the holder in the second operation is equal to the second distance. Therefore, when the transfer operation is to be performed, it is possible to precisely lower the holder in the second operation to a position at which the supporting member is spaced below the supported portion by at least the second distance, and cause the holder to appropriately perform the releasing operation of releasing the article.

Also, it is preferable that the holder includes a third sensor configured to detect a specific state in which the holder has reached a position spaced above the article by a distance equal to a difference between a holding enabled distance and a third distance, the holding enabled distance being a relative distance between the holder and the article in an up-down direction while the holder that is in a non-holding state of not holding the article is at a position where the holder is capable of performing a holding operation of holding the article placed on a placement portion, the controller causes the elevating device to perform a third operation of raising the holder by the third distance from a position at which the specific state is detected by the third sensor, in response to the specific state being detected by the third sensor while the holder in the non-holding state is gradually brought closer to the article on the placement portion from above, and the elevation operation includes the third operation.

With this configuration, when the holder in the non-holding state is lowered to perform the receiving operation of holding the article placed on the placement portion, it is possible to determine the rotation amount of the drive motor in the third operation in such a manner that an actual raising amount of the holder in the third operation is equal to the third distance. Therefore, when the receiving operation is to be performed, even if the holder has descended past the position at which the relative distance between the holder and the article is the holding enabled distance for some reason and reached a position where the specific state is detected by the third sensor, it is possible to precisely raise the holder in the third operation to the position at which the relative distance between the holder and the article is the holding enabled distance, and cause the holder to appropriately perform the holding operation of holding the article.

Also, it is preferable that the at least one placement portion includes a plurality of placement portions at different heights, and the controller sets the elevation operation range for each of the placement portions, and calculates the unit elevation amount corresponding to the set elevation operation range.

In the case where there are a plurality of placement portions for placement of the article at different heights, the elevation operation range varies depending on the height of each placement portion. Even in such a case, with this configuration, the rotation amount of the drive motor is determined with use of a unit elevation amount corresponding to each elevation operation range, and therefore, it is possible to improve precision of the elevation operation of the holder performed with respect to each placement portion.

It is sufficient that the article elevating device according to the present disclosure has at least one of the effects described above.

What is claimed is:

1. An article elevating device comprising:

a holder configured to hold an article;

an elevating device configured to raise and lower the holder; and a controller configured to control the elevating device, wherein the elevating device comprises:

a drum;

a belt that is wound around the drum in such a manner as to be capable of unwinding from the drum and wound around the drum;

a drive motor configured to drive the drum to rotate; and a transmission mechanism configured to transmit driving force from the drive motor to the drum, wherein the elevating device lowers the holder by unwinding the belt from the drum and raises the holder by winding the belt around the drum, while the holder is suspended with the belt, and wherein, while the controller performs an elevation operation that is at least either an operation of lowering the holder or an operation of raising the holder, the controller (i) calculates a unit elevation amount, which is an amount by which the holder is raised or lowered per unit rotation amount of the drive motor in an elevation operation range that is a range of heights of the holder in the elevation operation, in accordance with a change in a diameter of an outer circumferential surface of the belt wound around the drum due to winding of the belt and unwinding of the belt, and (ii) determines a rotation amount of the drive motor for the elevation operation based on the unit elevation amount, wherein the holder is initially arranged at a reference height and lowered toward a target height which is lower than the reference height before the elevation operation is performed to (i) calculate the unit elevation amount, (ii) determine the rotation amount for the elevation operation, and raise or lower the holder to the target height.

2. The article elevating device according to claim 1, wherein the controller determines the rotation amount of the drive motor by dividing a target elevation amount of the holder in the elevation operation by the unit elevation amount.

3. The article elevating device according to claim 2, wherein the controller controls the rotation amount of the drive motor based on a pulse count according to which one pulse corresponds to the unit rotation amount, and wherein the controller calculates the unit elevation amount with use of formula (1) below, $$PR=\pi/(RL\times PP)^2\times(RL\times PP\times DL-2\times TB\times UP) \quad (1)$$

where

PR is the unit elevation amount,

RL is a ratio of the rotation amount of the drive motor to a rotation amount of the drum, PP is a pulse count corresponding to one full rotation of the drive motor, DL is a diameter at a thickness center of an outermost turn of the belt wound around the drum while the holder is at a reference height, TB is a thickness of the belt, and UP is a pulse count corresponding to a rotation amount of the drive motor required to raise or lower the holder from the reference height to a height included in the elevation operation range.

4. The article elevating device according to claim 1, wherein:

the holder comprises a first sensor configured to detect the article at a position spaced above the article by a distance equal to a sum of a holding enabled distance and a first distance, the holding enabled distance is a relative distance between the holder and the article in an up-down direction while the holder that is in a non-holding state of not holding the article is at a position where the holder is capable of performing a holding operation of holding the article placed on at least one placement portion, the controller gradually brings the holder in the non-holding state closer to the article on the at least one placement portion from above, causes the elevating device to perform a first operation of lowering the holder by the first distance from a position at which the article is detected by the first sensor, and causes the holder to perform the holding operation at a position in the up-down direction at which the first operation is completed, and the elevation operation includes the first operation.

5. The article elevating device according to claim 4, wherein the at least one placement portion comprises a plurality of placement portions at different heights, and wherein the controller sets the elevation operation range for each of the placement portions and calculates the unit elevation amount corresponding to the set elevation operation range.

6. The article elevating device according to claim 1, wherein:

the holder comprises:

a supporting member configured to support a supported portion of the article from below; and a second sensor configured to detect whether the holder is (i) in a supporting state of supporting the article with the supporting member or (ii) in a non-supporting state of not supporting the article with the supporting member, the controller gradually brings the holder that is in a holding state of holding the article closer to a placement portion for placement of the article from above, causes the elevating device to perform a second operation of lowering the holder by a second distance from a position where transition from the supporting state to the non-supporting state is detected by the second sensor as a result of the article being placed on the placement portion, and causes the holder to perform a releasing operation of retracting the supporting member from below the supported portion at a position in an up-down direction at which the second operation is completed, and the elevation operation includes the second operation.

7. The article elevating device according to claim 1, wherein:

the holder comprises a third sensor configured to detect a specific state in which the holder has reached a position spaced above the article by a distance equal to a difference between a holding enabled distance and a third distance, the holding enabled distance is a relative distance between the holder and the article in an up-down direction while the holder that is in a non-holding state of not holding the article is at a position where the holder is capable of performing a holding operation of holding the article placed on a placement portion, the controller causes the elevating device to perform a third operation of raising the holder by the third distance from a position at which the specific state is detected by the third sensor, in response to the specific state being detected by the third sensor while the holder in the non-holding state is gradually brought closer to the article on the placement portion from above, and the elevation operation includes the third operation.

8. The article elevating device according to claim 1, wherein the transmission mechanism comprises a first shaft having a first gear and a second shaft having at least one second gear, the first shaft parallel to the second shaft, and wherein the transmission mechanism decelerates a rotation speed of the drum with respect to the drive motor.

* * * * *